United States Patent
Hugo et al.

(10) Patent No.: US 11,906,574 B2
(45) Date of Patent: Feb. 20, 2024

(54) HYBRID SOCKET WARP INDICATOR

(71) Applicant: International Business Machines Corporation, Armonk, NY (US)

(72) Inventors: Stephen Michael Hugo, Stewartville, MN (US); Theron Lee Lewis, Rochester, MN (US); Timothy Jennings, Rochester, MN (US); Timothy P. Younger, Rochester, MN (US); David J. Braun, St. Charles, MN (US); Jennifer I. Bennett, Rochester, MN (US); John R. Dangler, Rochester, MN (US); James D. Bielick, Pine Island, MN (US)

(73) Assignee: International Business Machines Corporation, Armonk, NY (US)

( * ) Notice: Subject to any disclaimer, the term of this patent is extended or adjusted under 35 U.S.C. 154(b) by 279 days.

(21) Appl. No.: 17/369,180

(22) Filed: Jul. 7, 2021

(65) Prior Publication Data

US 2023/0009784 A1 Jan. 12, 2023

(51) Int. Cl.
 *G01R 31/28* (2006.01)
 *H01R 12/57* (2011.01)
 (Continued)

(52) U.S. Cl.
 CPC .............. *G01R 31/281* (2013.01); *G01B 7/20* (2013.01); *H01R 12/57* (2013.01); *H05K 1/111* (2013.01);
 (Continued)

(58) Field of Classification Search
 CPC ........ G01B 7/20; G01B 7/345; G01R 31/281; G01R 31/2812; H01R 12/57;
 (Continued)

(56) References Cited

U.S. PATENT DOCUMENTS 6,792,675 B2   9/2004   Tran
7,438,581 B1   10/2008  Jeon
(Continued)

FOREIGN PATENT DOCUMENTS

CN   1508509 A   6/2004
CN   211476989 U   9/2020
(Continued)

*Primary Examiner* — Vinh P Nguyen
(74) *Attorney, Agent, or Firm* — CANTOR COLBURN LLP; Tihon Poltavets

(57) ABSTRACT

Aspects include a hybrid socket dynamic warp indicator for socket connector systems and methods of using the same to measure the warpage of a printed circuit board assembly. The method can include providing a printed circuit board having a plurality of pads and a socket. A warp indicator having a plurality of solder joint connections and a resistor array is electrically coupled to the printed circuit board to build a printed circuit board assembly. The printed circuit board assembly is subjected to a thermal event. A resistance across the resistor array is measured after the thermal event. A number of separations between one or more pads of the printed circuit board and one or more solder joint connections of the warp indicator is determined based on a change in the resistance. A defective warpage condition for the socket is determined based on the number of separations.

7 Claims, 5 Drawing Sheets

(51) Int. Cl.
  *H05K 1/11* (2006.01)
  *G01B 7/16* (2006.01)
  *H05K 3/40* (2006.01)

(52) U.S. Cl.
  CPC ..... *H05K 3/4007* (2013.01); *H05K 2201/068* (2013.01); *H05K 2201/10734* (2013.01)

(58) Field of Classification Search
  CPC ...... H05K 1/0268; H05K 1/111; H05K 1/181; H05K 2201/068; H05K 2201/10734; H05K 3/4007
  See application file for complete search history.

(56) References Cited

U.S. PATENT DOCUMENTS

| | | | |
|---|---|---|---|
| 7,648,847 B2* | 1/2010 | Schnetker | H05K 1/0268 |
| | | | 438/11 |
| 8,389,864 B2* | 3/2013 | Brown | H01L 23/562 |
| | | | 361/783 |
| 9,247,636 B2* | 1/2016 | Hoffmeyer | G06F 30/398 |
| 9,609,744 B2 | 3/2017 | Hoffmeyer et al. | |
| 10,697,851 B2* | 6/2020 | Bradbury | G01M 5/0083 |
| 11,558,964 B2* | 1/2023 | Bennett | H05K 1/0271 |
| 2005/0241168 A1 | 11/2005 | Iannuzzelli et al. | |

FOREIGN PATENT DOCUMENTS

| | | |
|---|---|---|
| JP | 2010118472 A | 5/2010 |
| KR | 101943501 B1 | 1/2019 |

\* cited by examiner

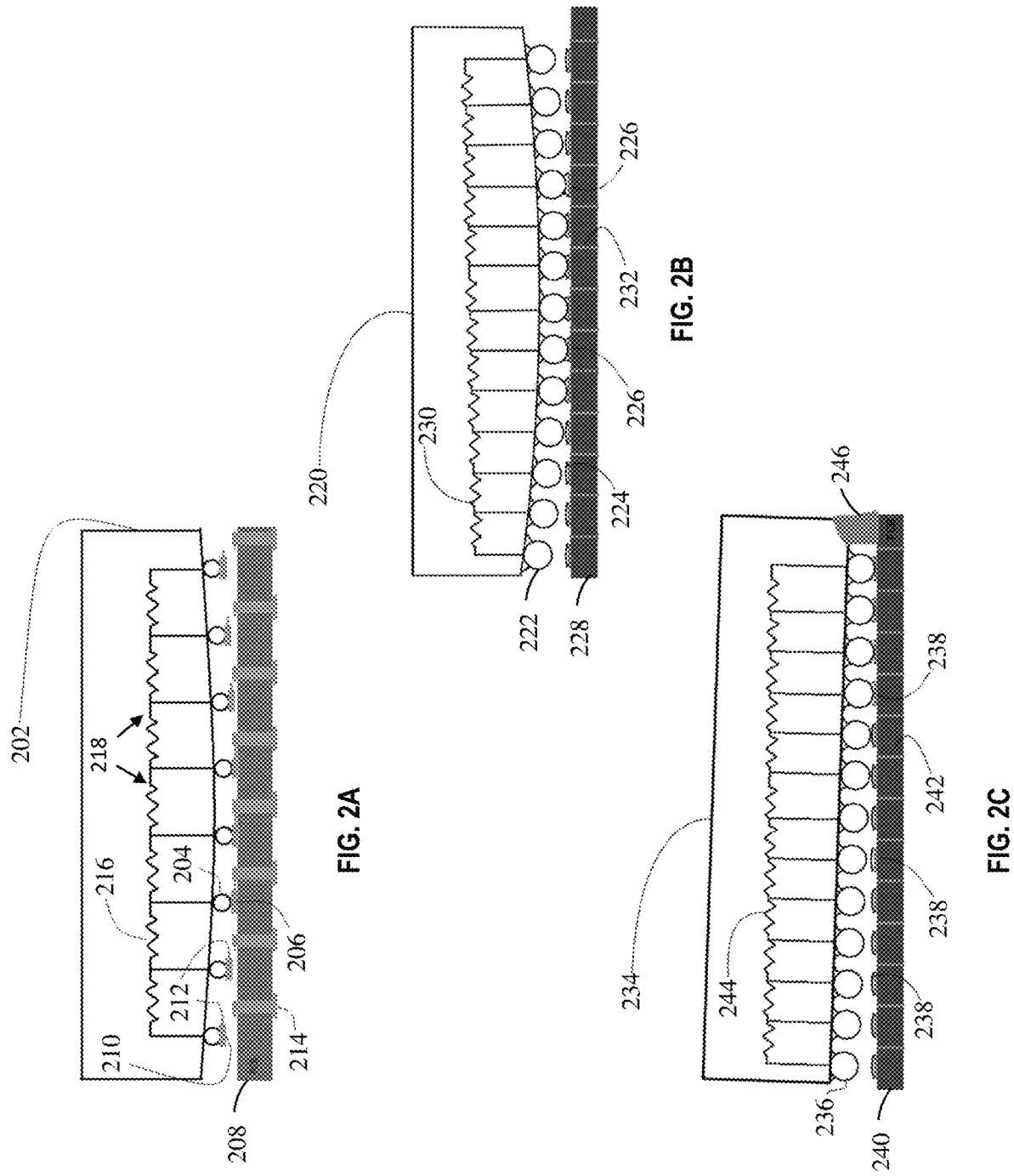

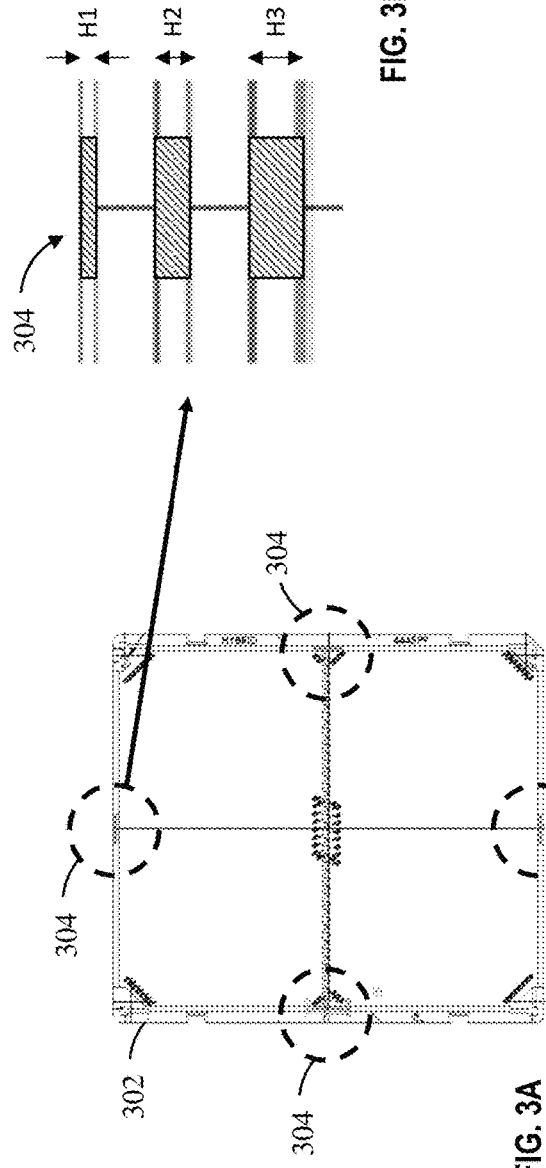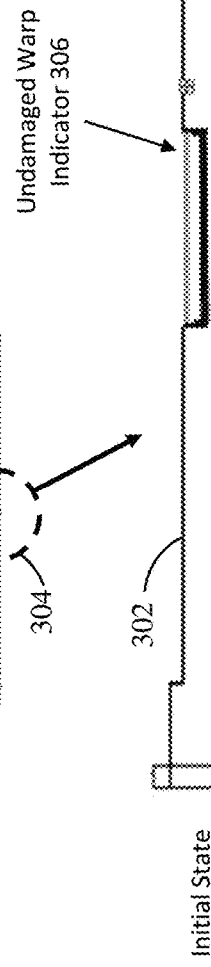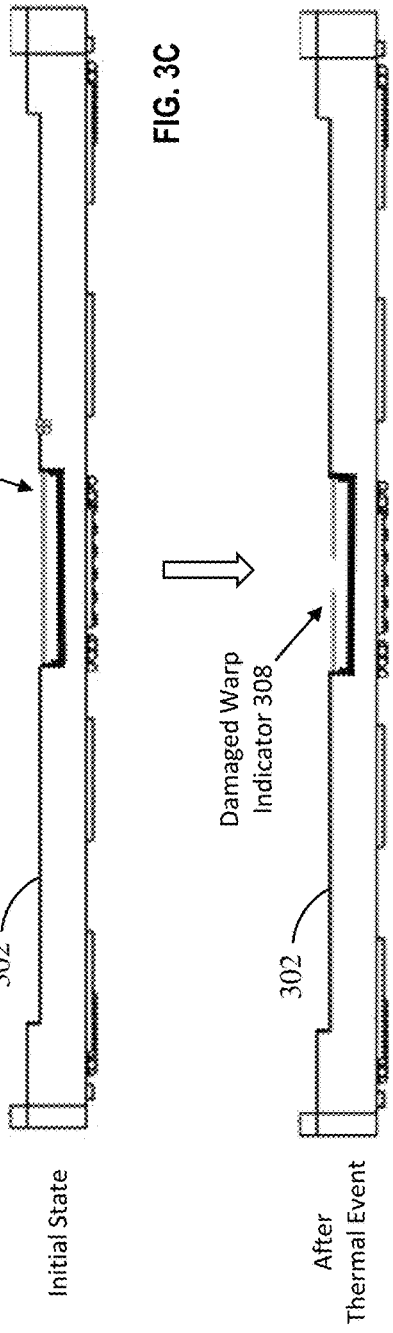

US 11,906,574 B2

HYBRID SOCKET WARP INDICATOR

BACKGROUND

The present invention generally relates to computer systems, and more specifically, to a hybrid socket dynamic warp indicator for printed circuit board assemblies (PCBAs) and their socket connector systems.

Printed circuit board assemblies (PCBAs) having a variety of electrical components are widely used in the electronics industry in products including computers, servers, televisions, and telecommunication devices. During PCBA assembly these components, which can include microprocessor central processing units (CPUs), secondary PCBAs (sometimes referred to as daughter cards), graphics processing units (GPUs) and other electrical components, are mechanically and electrically coupled to a primary PCB (referred to as the mother board). The card assembly process involves conditions that can result in component and PCB warpage. These components often need to be soldered to a coplanar surface on the PCB, and consequently, component and PCB warpage can result in solder defects.

Solder defects typically occur in the form of head-in-pillow (HIP) defects because of differences in thermodynamic warpage between components and the PCB during reflow, largely driven by different coefficients of thermal expansion (CTE) of materials within the components and the PCB. This is especially true for the Hybrid Socket BGA connector system due to complex shapes in the molded housing and the PCB warpage interactions. This is an industry wide issue that affects a variety of products and devices, such as server backplanes, where socketed high-performance modules are used.

SUMMARY

Embodiments of the present invention are directed to methods to measure the warpage between a printed circuit board and a hybrid socket. A non-limiting example method includes providing a printed circuit board having a plurality of pads. A warp indicator having a plurality of solder joint connections and a resistor array is electrically coupled to the printed circuit board. The warp indicator is produced in the same lot and with the same materials as the socket. The printed circuit board assembly is subjected to a thermal event. A resistance across the resistor array is measured after the thermal event. A number of separations between one or more pads of the printed circuit board and one or more solder joint connections of the warp indicator is determined based on a change in the resistance. A defective warpage condition for the socket, the printed circuit board, and/or the warp indicator is determined based on the number of separations.

Embodiments of the present invention are directed to methods to measure the warpage of a printed circuit board and a hybrid socket. A non-limiting example method includes forming a printed circuit board assembly having a warp indicator and a socket. The warp indicator can include an element manufactured to break when subjected to a predetermined amount of force. The predetermined amount of force can correspond to a known amount of warpage of the socket and/or printed circuit board. The method can include subjecting the printed circuit board assembly to a thermal event and determining that the element was damaged during the thermal event. A defective warpage condition for the printed circuit board and socket can be indicated in response to determining that the element was damaged.

Embodiments of the present invention are directed to a system having a hybrid socket dynamic warp indicator. A non-limiting example of the system includes a printed circuit board having a plurality of pads. A warp indicator having a plurality of solder joint connections and a resistor array is coupled to the printed circuit board. The warp indicator includes a material having a coefficient of thermal expansion (CTE) mismatch with the printed circuit board. A resistance across the resistor array changes in response to a thermal event.

Other embodiments of the present invention implement features of the above-described method in computer systems and computer program products.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 2A, 2B, and 2C illustrate cross-sectional views of dynamic warp indicators constructed in accordance with one or more embodiments of the present invention;

FIG. 3A illustrates a top-down view of a plurality of dynamic warp indicators incorporated within a PCBA in accordance with one or more embodiments of the present invention;

FIG. 3B illustrates two or more dynamic warp indicators incorporated in parallel at a same location on a PCBA;

FIG. 3C illustrates a cross-sectional view of a dynamic warp indicators prior to a thermal event;

FIG. 3D illustrates a cross-sectional view of a dynamic warp indicators after a thermal event;

DETAILED DESCRIPTION

Figure 1:
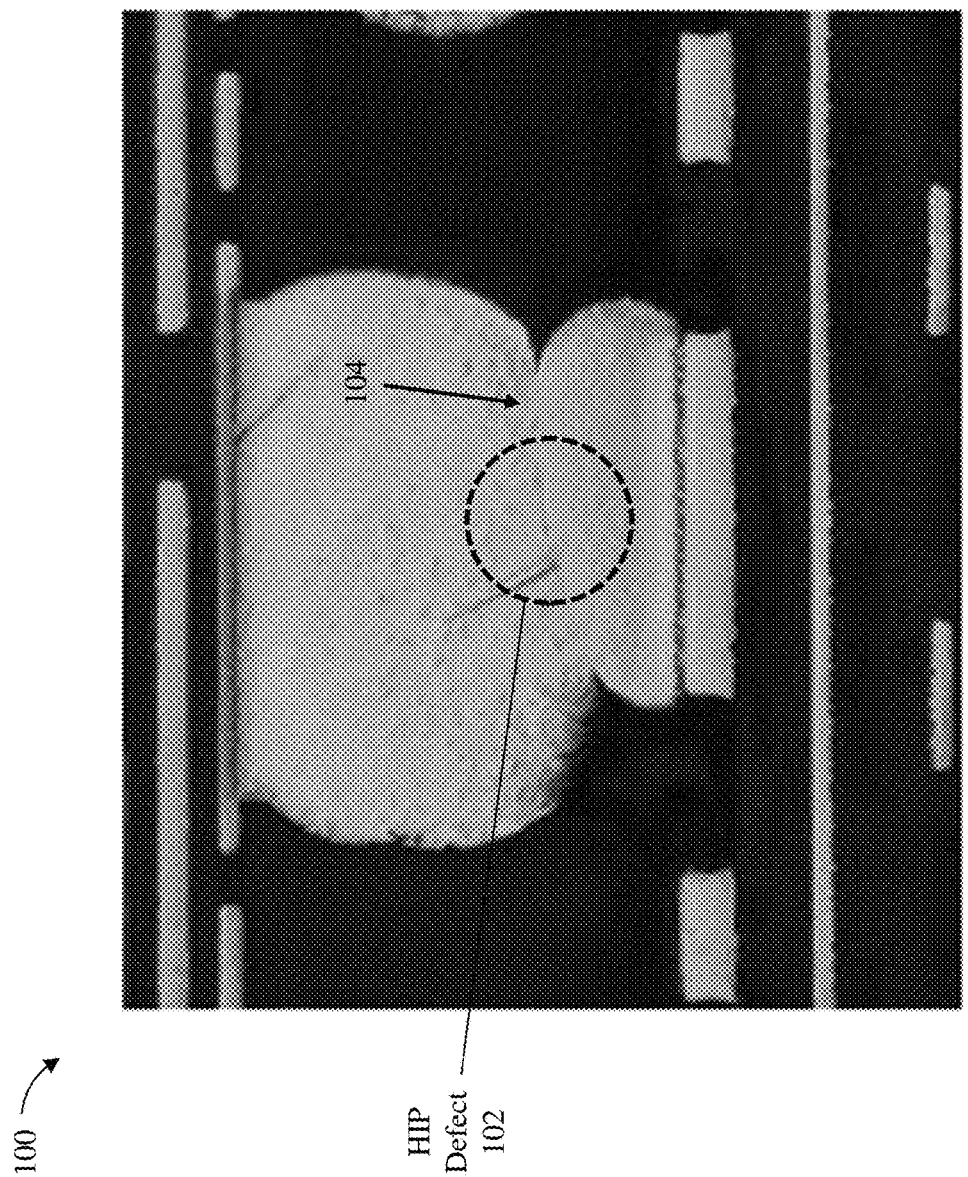
FIG. 1 depicts a package-PCBA assembly having a HIP defect.

Integrated circuits (ICs) are fabricated in a series of stages, including a front-end-of-line (FEOL) stage, a middle-of-line (MOL) stage, a back-end-of-line (BEOL) stage, and a far-back-end-of-line (FBEOL) stage. The process flows for fabricating modern ICs are often identified based on whether the process flows fall in the FEOL stage, the MOL stage, the BEOL stage, or the FBEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., CA) and other structures that communicatively couple to active regions (e.g., gate, source, and drain) of the device element. For example, the silicidation of source/drain regions, as well as the deposition of metal contacts, can occur during the MOL stage to connect the elements patterned during the FEOL stage. Layers of interconnections (e.g., metallization layers) are formed above these logical and functional layers during the BEOL stage to complete the IC. Most ICs need more than one layer of wires to form all the necessary connections, and as many as 5-12 layers are added in the BEOL process. The various BEOL layers are interconnected by vias that couple from one layer to another.

During the FBEOL stage, the semiconductor wafer is diced into individual semiconductor chips and those chips are assembled into semiconductor packages (also referred to as components) that are mounted to a printed circuit board (PCB). As used herein, a PCB refers to the unpopulated card, while the complete assembly (including the PCB and mounted components/packaging) is generally referred to as a printed circuit board assembly (PCBA). Typically, these packages are soldered to the PCB using solder bumps. The ball grid array (BGA) and hybrid land grid array (LGA) are two types of surface-mount packaging systems used for mounting integrated circuit components.

In a BGA, conductive pads are positioned on the bottom of the package, and each pad is initially covered by a solder ball. These solder balls (also referred to as solder spheres, or solder bumps) can be placed manually or by automated equipment. In the conventional PCB manufacturing process, the package is placed on a PCB with copper pads in a pattern that matches the solder balls. The assembly is then heated, either in a reflow oven or by an infrared heater, melting the balls. Surface tension causes the molten solder on each side of the assembly to melt together, holding the package in alignment with the circuit board at the correct separation distance. The solder is then allowed to cool and solidify, resulting in high quality soldered connections between the device and the PCB. Similarly, the hybrid land grid array (LGA) socket connector system is a socket array of land grid array metal contacts on one side, while on the other side solder is used to form attachments to the PCB, specifically with solder balls.

Regardless of the packaging system used (LGA, BGA, or otherwise), the solder balls are partially melted during a reflow process so that a metal bond can be formed between the solder and a pad (solder deposit) on the PCB surface. In some cases, defects occur in the solder interface between the device and the PCB, sometimes as a result of the reflow process. Head-in-pillow (HIP) defects, for example, have become a relatively common failure mode in the industry, specifically since the implementation of Pb-free technologies. The pervasiveness of HIP defects has also been exacerbated by the trend for decreasing pitch of components and usage of larger packaging arrays.

A HIP defect is the incomplete wetting and coalescence of the entire solder joint, resulting in an open or intermittent electrical connection. In other words, the PCB's solder and the solder ball do not come together to form a solid mass and adequate fillet. HIP defects are characterized as a process anomaly and the majority of HIP defects can be traced back to the reflow process. During reflow, warping of the component (or package) and the PCB can cause the solder balls on the component side to separate from the solder paste on the PCB side, resulting in limited or no wetting. These types of HIP defects are driven by thermomechanical warpage effects due to differences in the coefficients of thermal expansion (CTE) of the materials within the components and PCB. While the composite CTE of a hybrid socket and a PCB are almost identical, warpage is induced largely by CTE variations between resin, filler, and metallic structures in the socket and/or PCB. Warpage can cause lifting on one edge, opposite edges (sometimes referred to as a "potato chip" shape), the corners, or the center of the component. An example of a package-PCB assembly 100 having a HIP defect 102 is shown in FIG. 1. As depicted in FIG. 1, in the HIP defect 102 the solder interface between the package-side and PCB-side have not melted together. Instead, a solder boundary 104 runs along the solder interface.

The detection of warpage and the resulting HIP defects (or direct HIP detection) is difficult. Historical attempts to measure dynamic warp (PCB, socket, and/or component warpage) involve evaluating mechanical dimensions as a function of temperature in a lab setting. For example, residual warp post reflow has been used as an indicator of dynamic warpage. In the past, specific sockets have experienced warp that was greater than specifications allow due to inadequate socket supply material recipe controls. Similarly, HIP defects can be monitored using automated x-ray inspection systems. These systems can utilize various algorithms to assess solder joint integrity and can assign each solder joint a "GO" (good) or "NO GO" (bad) rating. However, these methods are not 100% effective as some HIP defects cannot be fully confirmed without the use of a three-dimensional (3D)/computed tomography (CT) x-ray or manual cross-sectioning, both of which are not available in typical production settings because these techniques are time consuming and cross-sectioning is destructive. These difficulties result in failures to detect out-of-spec warpage and HIP defects, resulting in HIP defect escapes and latent field failures.

One or more embodiments of the present invention address one or more of the above-described shortcomings by providing a hybrid socket dynamic warp indicator for PCBA socket connector systems. Embodiments of the present invention can be used to identify out of specification dynamic warp on any type of socket (e.g., hybrid socket BGA connector systems) without requiring slow and expensive techniques such as in-lab observation, cross-sectioning, and 3D/CT x-rays. Specifically, one or more embodiments of the present invention leverage physical features (warpage indicator features) integrated with or applied to the socket, PCB, and/or component that indicate whether the socket has been subjected to an amount of warp that is considered out of specification.

In some embodiments of the invention, a warpage indictor feature (also referred to as a warp indicator) is attached to sacrificial locations on a PCB to evaluate warpage. In some embodiments of the invention, the warp indicator is constructed such that the warp indicator reflects the same warpage characteristics as a socket (e.g., hybrid socket) on a PCBA. For example, the warp indicator can be made out of the same material as the socket and from the same build run as the socket (same datecode and equipment per the socket supplier). In this manner the warp indicator will mirror the warp characteristics of the socket. The warp indicator can be installed on an unused area of the PCBA and can be removed from the PCBA through a routing or cutting process. In some embodiments of the invention, the warp indicator materials can be tuned to ensure that the warp indicator is more sensitive to material property drift than the actual socket(s) targeted. In this manner, the warp indicator could be used as an ongoing process tool/in control limits by allowing Molded Apparatus Monitors to detect material property drifts in the warp indicator before the actual production socket yield performance degraded significantly. In some embodiments of the invention, the warp indicator is not required to exactly match the socket warpage, but instead exhibits warpage characteristics proportional to that of the production sockets due to use of same material lot, equipment, and processes. This warpage proportionality can be determined empirically via experimentation.

The indicator feature can be made from hybrid socket materials and can include, for example, internal pin-to-pin daisy chain connections having a known resistance. Various PCB pads on the indicator feature can have connections to test points for In Circuit Test (ICT) access. In this manner a defective warpage (i.e., out-of-spec warp) can be easily detected in a non-destructive manner (from the PCB and socket perspective) by noting changes in resistance measurements during ICT.

In some embodiments of the invention, a warpage indicator feature is integrated as part of the design of a hybrid socket. This indicator feature can be fabricated such that it undergoes a destructive action when subjected to an out-of-spec condition. For example, when the socket is subjected to an out-of-specification dynamic warp the indicator can be damaged (i.e., a destructive action occurs) in a manner which can be readily observed visually. Advantageously, the destructive action can be used to confirm that the component was subjected to the "bad" condition even if the condition itself is no longer present or apparent.

Leveraging warpage indicator features according to one or more embodiments can reduce the number HIP defect escapes in a fabrication run. Consequently, latent field failures related to this defect condition can be reduced or eliminated. Another advantage is a reduction in production time by reducing the requirement for automated x-ray inspection systems. For example, if a part has little to no warpage, that part may be deemed acceptable and not require x-ray-based inspection.

Yet another advantage of one or more embodiments of the present invention lies in the custom nature of the warpage indictor features, which can be designed to provide warpage limit indications that are unique to each socket, component, and/or PCB. In other words, warpage indicator features can be customized to break or otherwise indicate warpage limit failures (e.g., via ICT resistance measurements) when subjected to different conditions (temperatures, pressures, forces, etc.). For example, a first indicator can be designed to break when subjected to a first amount of force, while a second indicator can be designed such that the first amount of force is not sufficient to cause damage. Thus, these indicators can be provided in separate devices, optimized to detect each respective device's unique out-of-warp requirements. Alternatively, these indicators can be provided in the same device, effectively improving the resolution in detecting out-of-spec conditions. For example, using several indicators together, each having a different break condition, could allow for otherwise unobservable conditions to be bounded by minimum and maximum ranges (e.g., 50% of the socket's out-of-spec condition was reached, but not 80%, or 120%, etc., when one, but not all, of the indicators fail).

FIGS. 2A, 2B, and 2C illustrate cross-sectional views of dynamic warp indicators constructed in accordance with one or more embodiments of the present invention. As shown in FIG. 2A, a dynamic warp indicator 202 can include a plurality of solder balls 204 configured to be electrically coupled (soldered) to a respective plurality of pads 206 on a PCB 208. In some embodiments of the invention, the dynamic warp indicator 202 can be attached to an unused area of the PCB 208. The PCB 208, the dynamic warp indicator 202, and any components and sockets (not separately shown) mounted to the PCB 208 collectively define a PCBA.

In some embodiments of the invention, the dynamic warp indicator 202 is made of one or more materials (e.g., hybrid socket materials) selected to mirror the warp characteristics of a socket on the PCBA under normal operating conditions. For example, the dynamic warp indicator 202 can be made of a same material and by a same process as the socket. In other words, the dynamic warp indicator 202 can be constructed to purposely create a coefficient of thermal expansion (CTE) mismatch with the PCB 208 that mirrors the CTE mismatch between the PCB 208 and the socket. This CTE mismatch can be leveraged to identify warpage between the socket and the PCB 208. For example, heat from the solder process itself can cause the PCB 208 and/or the dynamic warp indicator 202 to warp (flex), resulting in one or more connections between a solder ball and a pad to break.

In some embodiments of the invention, the dynamic warp indicator 202 is linear, that is, a single row of solder joint connections (e.g., solder balls 204) are positioned to detect a warping effect across the long axis of the PCB 208. During the solder heating process the row of solder joint connections will create z directional force vectors (perpendicular to the major surface of the PCB 208) in opposition to the PCB 208. As shown in FIG. 2A, these forces can result in warpage which damages various connecting structures in the PCB 208. For example, a delaminated pad 210 can be pulled from the surface of the PCB 208, breaking a trace 212 (e.g., a dog bone trace) to a through hole via 214. In some embodiments of the invention, broken connections are concentrated at ends of the PCB 208, e.g., at points of maximum flex (as shown in FIG. 2A), although connections can be broken at any point along the dynamic warp indicator 202/PCB 208.

In some embodiments of the invention, the dynamic warp indicator 202 includes a resistor array 216 having internal pin to pin daisy chain connections 218. In some embodiments of the invention, each of the pin to pin daisy chain connections 218 has a known resistance. In some embodiments of the invention, each pin to pin daisy chain connection has a same resistance, while in other embodiments each pin to pin daisy chain connection has a different resistance.

In some embodiments of the invention, the solder process during normal operation is known to "break" various connections due to warpage caused by forces due to heat and CTE mismatches. For example, warpage can result in one or more separations between connecting structures on the PCB 208 (traces, pads, etc.) and the dynamic warp indicator 202 (more specifically, the solder balls 204). In some embodiments of the invention, the actual level or amount of solder warpage can be determined by identifying how many of these separations occur. In some embodiments of the invention, the pads 206, the dynamic warp indicator 202, and/or the through hole via 214 can serve as test points for in circuit test (ICT) access. In some embodiments of the invention, resistance measurements across the resistor array 216 can be taken at ICT to determine the number of separations. In some embodiments of the invention, separations due to warpage (and the accompanying change to the electrical path) changes the resistance of one or more of the internal pin to pin daisy chain connections 218 of the resistor array 216. In some embodiments of the invention, changes in resistance across the internal pin to pin daisy chain connections 218 of the resistor array 216 can be measured to identify these separations.

In some embodiments of the invention, the number of separations and/or their physical locations on the PCB 208 are compared against an expected number and/or positioning of separations. An expected number of separations and/or their anticipated distribution (i.e., first 4 rows from the die edge, etc.) can be uniquely determined for each production unit. In some embodiments of the invention, the actual number of separations and their spatial distribution are compared against the expected values to determine whether the actual warpage is within acceptable ranges. In some embodiments of the invention, a defective variation warpage would be indicated by a higher than expected number of separations on the PCB 208. In some embodiments of the invention, defective variations in warpage are indicated when the actual number of separations exceeds the expected number of separations by a predetermined threshold (e.g., 110%, 120%, etc.). Advantageously, because the dynamic warp indicator 202 is built to mirror the warpage characteristics of a socket on the PCB 208, a defective warpage result can be used to indicate a defective socket warpage condition.

In some embodiments of the invention, warpage measurements for a group of PCBAs can be assessed to enable Statistical Process Control (SPC). In some embodiments of the invention, SPC leverages parametric data to predict excessive warpage. In some embodiments of the invention, SPC can be used to increase the traceability of warp features. In some embodiments of the invention, longer resistance arrays can be tuned to provide a graduated scale that measures warpage more accurately. Alternatively, or in addition, PN junctions of an existing PCB/component package could be used instead of or in addition to a resistor array to measure warpage. PN junctions can be tested with a diode test to ground.

FIG. 2B illustrates a dynamic warp indicator 220 having a plurality of solder balls 222 configured to be electrically coupled (soldered) to a respective plurality of pads 224, 226 on a PCB 228. The dynamic warp indicator 220 can be formed in a similar manner as the dynamic warp indicator 202, and can include, for example, a resistor array 230. As shown in FIG. 2B, warpage can result in separation between some of the pads (separated pads 224) and the solder balls 222 of the dynamic warp indicator 220. As further shown in FIG. 2B, some of the pads (intact pads 226) remain electrically coupled to a respective solder ball of the solder balls 222. In some embodiments of the invention, resistance measurements of the resistor array 230 can be taken to indicate where these separations occur (and how many occur). In some embodiments of the invention, resistance measurements are taken through one or more through hole vias 232 in the PCB 228. In addition, or alternatively, resistance measurements can be taken through one or more contact locations on the dynamic warp indicator 220 (not separately shown).

FIG. 2C illustrates a dynamic warp indicator 234 having a plurality of solder balls 236 configured to be electrically coupled (soldered) to a respective plurality of pads 238 on a PCB 240. The PCB 240 can include or more through hole vias 242. The dynamic warp indicator 234 can include a resistor array 244. In some embodiments of the invention, an anchor 246 can be used to fix a portion (e.g., corner, edge) of the dynamic warp indicator 234 to the PCB 240.

Fixing a portion of the dynamic warp indicator 234 to the PCB 240 will ensure a worst-case warpage scenario between the dynamic warp indicator 234 and the PCB 240. A molded socket displays characteristic warpage behaviors that are independent of the respective PCB it is being soldered to. This characteristic warpage creates a spherical concave surface shape with raised corners and edges. Constraining one edge of this spherical shape to the PCB will force the opposing edge further off the PCB—in effect, magnifying the warpage on the unconstrained end. Defects can be expected to occur on the unconstrained end of the apparatus due to the more severe gap variation during reflow, including possible hot tear, fracture, HIP or nonwets situations. Advantageously, the increased magnitude of gap variations on the unconstrained end can simplify the monitoring of soldering defects by making those defects more pronounced.

Worst case warpage can be useful when conducting experiments for qualification and failure analysis (e.g., stress tests). In some embodiments of the invention, the anchor 246 include an adhesive. In some embodiments of the invention, the adhesive can be applied after component placement but before reflow. In some embodiments of the invention, the adhesive can be applied before component placement but after a stencil operation. The adhesive can be applied to either or both of a surface of the PCB 240 or a surface of the PCB connector housing (not separately shown). In some embodiments of the invention, the reflow processed used to couple components to the PCB 240 also causes the adhesive to cure, locking the dynamic warp indicator 234 in place for subsequent maximum warpage testing. In some embodiments of the invention, the adhesive is a UV-activated adhesive and a UV light is used for curing.

While the dynamic warp indicators 202, 220, and 234 are shown in a simplified linear configuration for ease of discussion, other configurations offering additional or alternative advantages are possible. For example, in some embodiments of the invention, the dynamic warp indicator is configured to measure warpage across 2 dimensions of the PCB. For example, the dynamic warp indicator can include an array of solder joint connections configured in a rectangular fashion. In some embodiments of the invention, the dynamic warp indicator is configured in a radial fashion where the various solder joints are arranged on spokes extending from a radial hub (not separately shown). These types of configurations would allow for nonlinear warpage measurements. Moreover, while the dynamic warp indicators 202, 220, and 234 are described as made from hybrid socket materials, in some embodiments of the invention, different materials having different CTE mismatches with the PCB (and, consequently, different warpage characteristics) are incorporated within the dynamic warp indicators. In some embodiments of the invention, the various materials are selected to provide varying degrees of warpage sensitivity over respective portions of the PCB. For example, materials can be tuned to provide a higher warpage sensitivity for portions of the PCB where warpage has been historically highest, or lowest (or according to any other desired criteria). In this manner, dynamic warp indicators having various sections, each made of a different material having a different CTE mismatch to the PCB, can be used to selectively increase the effective warpage detection resolution at one or more locations on the PCB.

FIG. 3A illustrates a top-down view of a plurality of dynamic warp indicators incorporated within a socket in accordance with one or more embodiments of the present invention. As shown in FIG. 3A, a socket 302 can include one or more dynamic warp indicators 304. In some embodiments of the invention, the dynamic warp indicators 304 are positioned at center or edge locations of the socket 302. For example, the dynamic warp indicators 302 can be embedded within the plastic frame (housing) of the socket 302. Although the dynamic warp indicators 304 are depicted in a particular arrangement for ease of discussion, it should be understood that the number and positioning of the dynamic warp indicators is not meant to be particularly limited. In some embodiments of the invention, more or fewer dynamic warp indicators can be incorporated within the socket 302 in a similar manner. The location of each of the dynamic warp indicators can be varied (i.e., located on the edge, in the middle, off center, etc.).

In some embodiments of the invention, the dynamic warp indicators 304 are made to break when subjected to a specific, predetermined amount of force. For example, the dynamic warp indicators 304 can be made of a plastic that is embedded in the frame of the socket 302. In some embodiments of the invention, the material, thickness, length, etc. of the plastic (or any other material) is selected to ensure breakage at a specific amount of warpage. For example, a dynamic warp indicator can be specified to break when/if the socket 302 warps during reflow (or any other thermal event) more than a predetermined threshold. This threshold can correspond, for example, to industry limits (e.g., 0.20 mm is the current industry standard for excessive warpage). For example, the dynamic warp indicators 304 can be made of a plastic beam that will break when the socket 302 warps more than 0.20 mm. In some embodiments of the invention, various predetermined amounts of force can be correlated with respective warpage amounts during a test phase where a socket and/or PCB is purposefully warped until breakage occurs. Once breakage occurs, the amount of force on the socket can be measured and used to design a specific dynamic warp indicator. While plastics are suitable materials, the actual material selected for the dynamic warp indicators 304 is not meant to be particularly limited. Other materials are possible, so long as the final beam or warpage indicator element has the requisite mechanical characteristics to break when subjected to a predetermined amount of tensile and/or compressive warpage.

Moreover, while a single dynamic warp indicator is shown at each location on the socket 302, other configurations are possible. FIG. 3B, for example, shows an alternative arrangement where two or more dynamic warp indicators 304 are incorporated in parallel at a same location on the socket 302. In some embodiments of the invention, each of the dynamic warp indicators can be made to have a different height or thickness (e.g., H1, H2, H3, etc.), and/or of a different material. In this manner, the dynamic warp indicators can be designed to break when subjected to different amounts of force. Advantageously, several dynamic warp indicators, each having different breakage characteristics, can used in parallel to increase the warpage detection resolution by spanning a range of nonoverlapping break conditions. For example, the dynamic warp indicator having height/thickness H2 can correspond to a warpage of 0.20 mm, while the dynamic warp indicators H1 and H3 can correspond to 50%, 70%, 110%, 150%, etc. of the H2 warpage.

In some embodiments of the invention, the dynamic warp indicators 304 are beams (e.g., plastic beams) embedded and/or molded within socket frames of the socket 302. In some embodiments of the invention, the dynamic warp indicators 304 are molded with the socket 302 at the same time as one or more components of the socket 302. In some embodiments of the invention, the dynamic warp indicators 304 are embedded within the socket 302 post-mold (i.e., after components have been added to the socket 302).

FIG. 3C illustrates a cross-sectional view of one of the dynamic warp indicators 304 of FIG. 3A prior to a thermal event. In other words, FIG. 3C depicts an undamaged dynamic warp indicator 306 at an initial state prior to being damaged due to warpage. FIG. 3D illustrates a cross-sectional view of the dynamic warp indicator of FIG. 3C after the thermal event. As shown in FIG. 3D, the dynamic warp indicator of FIG. 3C is damaged (broken or otherwise severed) due to stresses caused by warpage during the thermal event. The dynamic warp indicators of FIGS. 3C and 3D can be made to break when subjected to a predetermined amount of force. The breakage force can correspond, for example, to an amount of warpage, as discussed previously. Advantageously, the damaged dynamic warp indicator 308 can be easily observed, allowing for a non-invasive visual confirmation that the socket 302 was subjected to an out-of-tolerance degree of warpage. Moreover, visual inspection of the dynamic warp indicators 306, 308 can be used to evaluate warpage of the socket 302 in a loose connector state or when incorporated within a PCBA.

Figure 4:
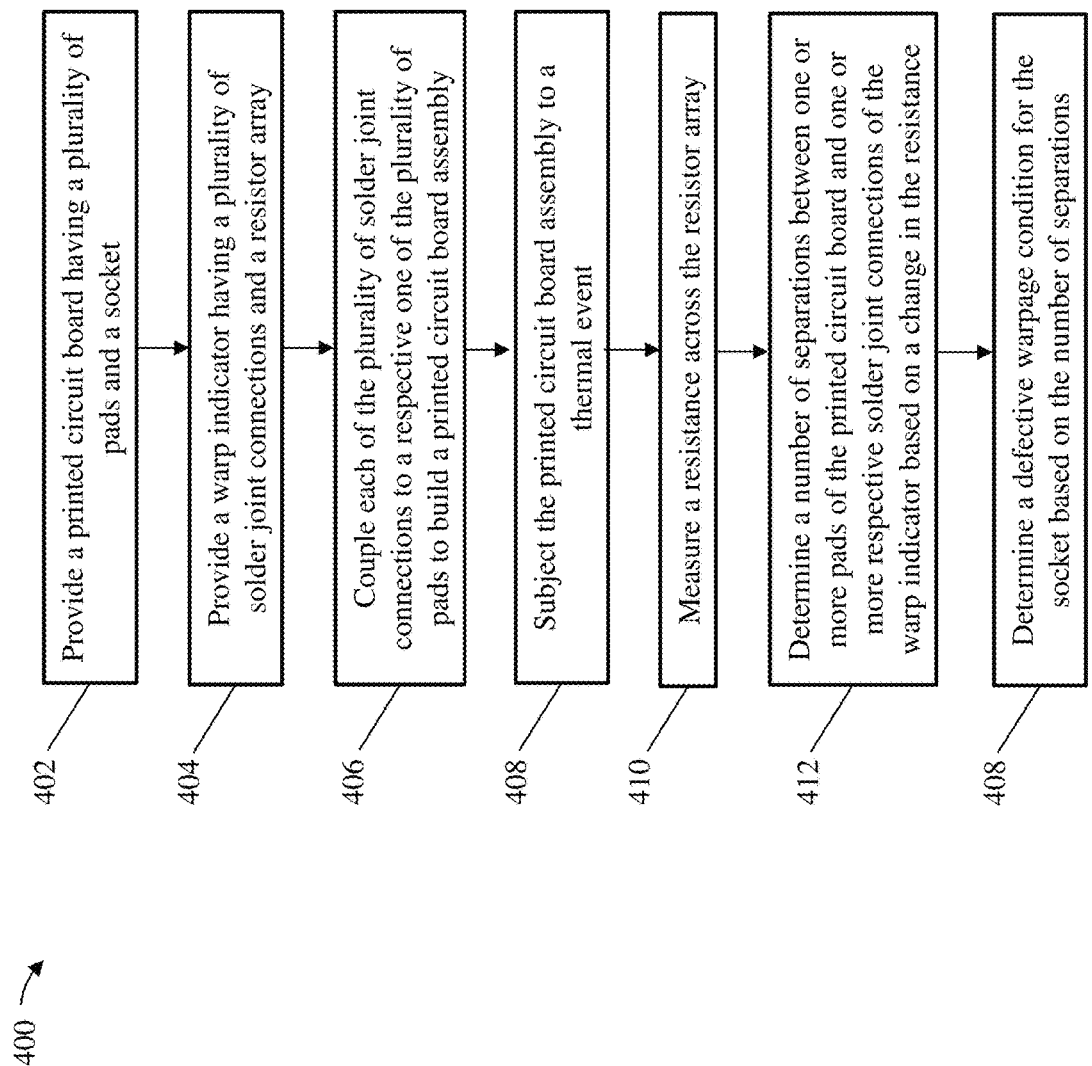
FIG. 4 is a flowchart in accordance with one or more embodiments of the present invention.

Referring now to FIG. 4, a flowchart 400 for leveraging a hybrid socket dynamic warp indicator to measure PCB warpage is generally shown according to an embodiment. The flowchart 400 is described in reference to FIGS. 1-3D and may include additional steps not depicted in FIG. 4. Although depicted in a particular order, the blocks depicted in FIG. 4 can be rearranged, subdivided, and/or combined. At block 402, a printed circuit board having a plurality of pads is provided.

At block 404, a warp indicator having a plurality of solder joint connections is provided. The warp indicator can include a resistor array. In some embodiments of the invention, the warp indicator includes a material having a CTE mismatch with the printed circuit board that mirrors the CTE mismatch between the PCB and a socket on the PCB (i.e., within the PCBA). In some embodiments of the invention, the solder joint connections include a single row of solder balls. In some embodiments of the invention, the solder joint connections include a two-dimensional array of solder balls. In some embodiments of the invention, the solder joint connections include solder balls arranged on spokes extending from a radial hub.

At block 406, each of the plurality of solder joint connections is coupled to a respective one of the plurality of pads. At block 408, the printed circuit board assembly is subjected to a thermal event. In some embodiments of the invention, the thermal event is a solder reflow or rework. The thermal event can cause warpage in the warp indicator, the PCB, and/or the socket.

At block 410, a resistance is measured across the resistor array. In some embodiments of the invention, the resistor array includes a plurality of internal pin to pin daisy chain connections. In some embodiments of the invention, resistance measurements can be made across one or more of the internal pin to pin daisy chain connections. In some embodiments of the invention, the plurality of internal pin to pin daisy chain connections of the resistor array are electrically coupled to test points for In Circuit Test (ICT) access. In some embodiments of the invention, the test points are coupled to one or more of the plurality of pads of the printed circuit board.

At block 412, a number of separations between one or more pads of the printed circuit board and one or more respective solder joint connections of the warp indicator is determined based on a change in the resistance. At block 414, a defective warpage condition is determined based on the number of separations. The defective warpage condition can be for the warp indictor, the printed circuit board, and/or a mounted socket.

In some embodiments of the invention, the warp indicator is positioned on an unused portion of the printed circuit board. In some embodiments of the invention, an end of the warp indicator is anchored or otherwise fixed to an end of the printed circuit board.

Figure 5:
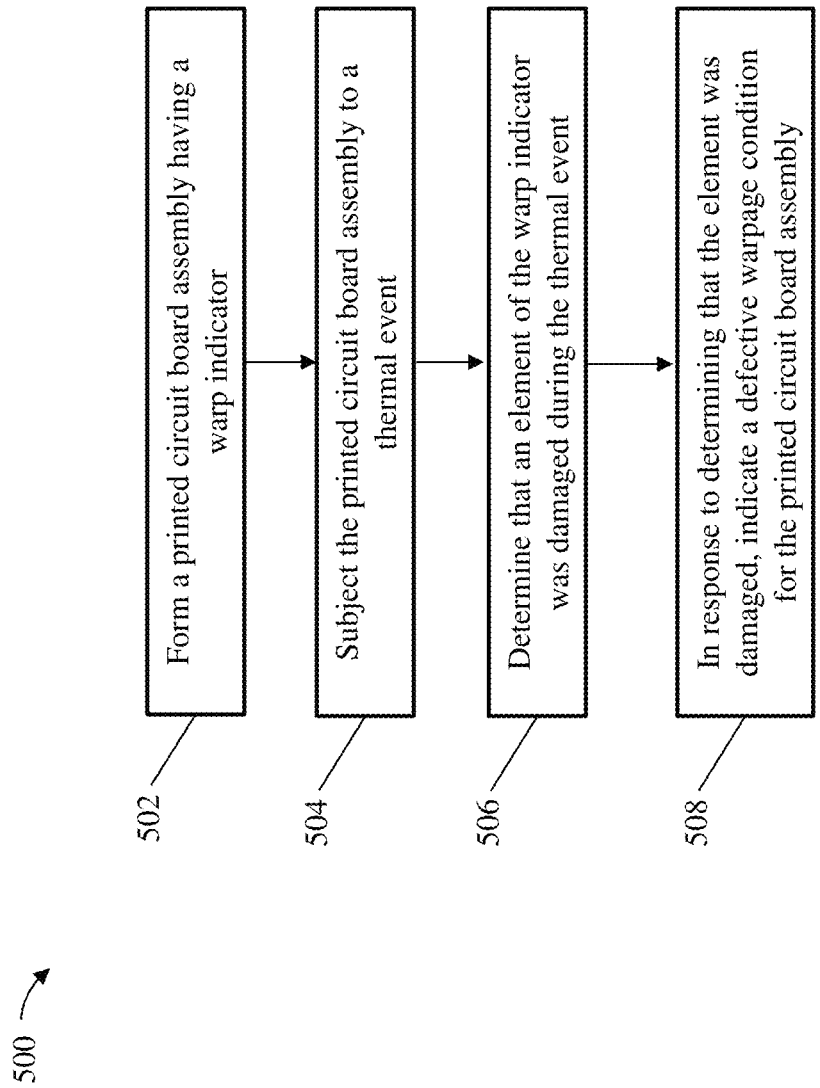
FIG. 5 is a flowchart in accordance with one or more embodiments of the present invention.

Referring now to FIG. 5, a flowchart 500 for leveraging a hybrid socket dynamic warp indicator to measure PCB warpage is generally shown according to an embodiment. The flowchart 500 is described in reference to FIGS. 1-3D and may include additional steps not depicted in FIG. 5. Although depicted in a particular order, the blocks depicted in FIG. 5 can be rearranged, subdivided, and/or combined.

At block 502, a printed circuit board assembly having a warp indicator is formed. The warp indicator can include an element manufactured to be damaged (e.g., break, fracture, split, crack, sever, etc.) when subjected to a predetermined amount of force. In some embodiments of the invention, the predetermined amount of force corresponds to a known amount of warpage of the printed circuit board assembly. For example, the known amount of warpage of the printed circuit board assembly can match an industry standard for warpage, such as, for example, 0.20 mm. In some embodiments of the invention, the element includes a plastic beam. In some embodiments of the invention, the element is embedded within a frame of the printed circuit board assembly.

At block 504, the printed circuit board assembly is subjected to a thermal event. In some embodiments of the invention, the thermal event is a solder reflow or rework. At block 506, the element is checked to determine whether the element was damage during the thermal event. At block 508, in response to determining that the element was damaged, a defective warpage condition for the printed circuit board assembly is indicated.

In some embodiments of the invention, the printed circuit board assembly further includes a second warp indicator having a second element. In some embodiments of the invention, the second element is manufactured to break when subjected to a different predetermined amount of force. In some embodiments of the invention, the element is damaged during the thermal event and the second element is not damaged during the thermal event.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, conventional techniques related to semiconductor device, integrated circuit (IC), printed circuit board (PCB), printed circuit board assemblies (PCBAs), and/or surface mount technology (SMT) device and component fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method comprising:

forming a printed circuit board assembly comprising a warp indicator and a socket, the warp indicator comprising an element manufactured to be damaged when subjected to a predetermined amount of force, wherein the predetermined amount of force corresponds to an out-of-tolerance warpage of the printed circuit board;

subjecting the printed circuit board assembly to a thermal event, the thermal event resulting in the out-of-tolerance warpage of the printed circuit board and at least the predetermined amount of force being applied to the warp indicator, causing the element to fracture;

determining that the element was damaged during the thermal event, wherein determining that the element was damaged comprises visually inspecting the element to confirm the fracture, thereby allowing for a non-invasive visual confirmation that the socket was subjected to the out-of-tolerance warpage; and in response to determining that the element was damaged, indicating a defective warpage condition for the printed circuit board assembly.

2. The method of claim 1, wherein the element comprises a plastic beam.

3. The method of claim 2, wherein the element is embedded within the socket of the printed circuit board assembly.

4. The method of claim 1, wherein the thermal event is a solder reflow or rework.

5. The method of claim 1, wherein the printed circuit board assembly further comprises a second warp indicator comprising a second element.

6. The method of claim 5, wherein the second element is manufactured to break when subjected to a different predetermined amount of force.

7. The method of claim 5, wherein the element is damaged during the thermal event and the second element is not damaged during the thermal event.

\* \* \* \* \*